United States Patent [19]
Gupta et al.

[11] Patent Number: 5,468,339
[45] Date of Patent: Nov. 21, 1995

[54] PLASMA ETCH PROCESS

[75] Inventors: Subhash Gupta, San Jose; Susan H. Chen, Sunnyvale, both of Calif.

[73] Assignee: Advanced Micro Devices, Inc., Sunnyvale, Calif.

[21] Appl. No.: 960,499

[22] Filed: Oct. 9, 1992

[51] Int. Cl.⁶ .................................................. H01L 21/00
[52] U.S. Cl. ............................................. 216/67; 216/79
[58] Field of Search ................................ 156/643, 646, 156/656, 657, 644; 437/192, 228

[56] References Cited

U.S. PATENT DOCUMENTS

| | | | |
|---|---|---|---|
| 4,438,315 | 3/1984 | Toyoda et al. | 156/646 X |
| 4,534,816 | 8/1985 | Chen et al. | 156/345 |
| 4,948,459 | 8/1990 | van Laarhoven et al. | 156/657 X |
| 4,978,420 | 12/1990 | Bach | 156/644 X |
| 5,021,121 | 6/1991 | Groechel et al. | 156/643 |
| 5,176,790 | 1/1993 | Arleo et al. | 156/643 |
| 5,213,659 | 5/1993 | Blalock et al. | 156/643 |
| 5,227,335 | 7/1993 | Holschwandner et al. | 437/192 |
| 5,269,879 | 12/1993 | Rhoades et al. | 156/643 |
| 5,284,549 | 2/1994 | Barnes et al. | 156/662 |

*Primary Examiner*—Thi Dang

[57] ABSTRACT

An improved $SiO_x$ etch which employs $CHF_3$, $N_2$ and a light mass cooling gas in total pressure on the order of 3000 mT in a confined plasma reactor. High aspect ratios at least 10:1 are obtainable.

12 Claims, 4 Drawing Sheets

PLASMA ETCH PROCESS

FIELD OF THE INVENTION

The present invention relates to new dry etching processes for etching silicon compounds and in particular to a process which has applicability for making high aspect ratio holes in $SiO_x$ compounds or glass.

BACKGROUND OF THE INVENTION

There are many electrical and semiconductor devices and processes which can be improved by a technique for more rapid silicon compound or glass etch. The test of a good etch process is its ability to make high aspect ratio holes. In the prior art, the highest reported ratio of depth/diameter, i.e., aspect ratio, R, of such holes in silicon compounds is on the order of R=1.5. Also, as the diameter of the holes has become smaller, the achievable aspect ratios employing dry etch technology has been getting worse. Accordingly, there is a need for improved processes for silicon based materials. It is understood that any etch process which can quickly make high aspect ratio holes in a material without surface damage is a good general etchant of the material.

Ion bombardment of surfaces is an important aspect of plasma etching, reactive ion etching, and sputter deposition. Ion bombardment also is an important part of several analytical techniques such as secondary ion mass spectrometry (SIMS) and low energy ion scattering spectroscopy (LEIS). Auger electron spectrometry (AES) also employs low energy inert gas ions for physical sputtering to obtain erosion to support depth profiling. Although these have become very important processes, the ion induced surface chemistry and alteration of new surface chemical, physical and electronic characteristics are very complex and remain poorly understood processes. This has lead to the empirical development of most commercial plasma assisted etching processes.

Plasmas are partially ionized quasi-neutral gases. They can be created in a vacuum chamber by applying enough electric field to ionize the gases. The power source may be a DC electric field, inductive RF coil, microwaves or a capacitively coupled RF electric field. Electrons have small mass relative to other particles so most of the energy gained in these systems is initially absorbed by the electrons. These high energy electrons collide with other particles and ionize the gas and sustain the plasma. The typical ionization potential is high so that the majority of molecules and atoms stay neutral. Eventually, a DC potential will build up between a plasma and any dielectric surface nearby, preventing any further imbalance.

In general, semiconductor processing plasmas are in a state of thermal non-equilibrium and are affected by the following:

(a) Power—By increasing power absorbed the sheath potential is increased as well as the number of ions produced. Any wafer within the plasma will experience induced temperature increases from increased ion energy bombardment as well as increased ion flux. Obviously, more damage can be done to the substrate at higher powers.

(b) Pressure—At higher pressures, more gas molecules are available which is generally believed to result in higher ion flux. Very fast etching is frequently accompanied by surface damage usually occurring with energetic ions. While such surface damage is expected with heavy ions, it has also been documented with light ions.

(c) Device Configuration—Parameters such as chamber geometry including positioning of the substrate, magnet configuration, chamber materials and ion density uniformity will affect the etching process.

It is postulated that the explanation for the distinctly different etching rates of materials by various etchant gases has to do with the ability of the reactive gas molecule to penetrate into the stirface being etched and to break the subsurface bond or lower the binding energy for the surface atoms and to replace that bond by bonding itself to the subsurface such that the released product is volatile at the temperature of release. It is believed that when an energetic ion strikes a solid, it transfers its energy to near surface atoms through a series of elastic collisions and electronic and vibrational processes. Collisional cascade effects can produce ion implantation, crystalline damage, ion mixing and physical sputtering. These effects can also result from low energy ion bombardment. Ion mixing is the process under which target atoms are relocated by ion impact, which process is broken up by recoil and cascade contributions. It is believed that mixing processes may be important in enhancing volatile product formation. This is distinct from sputtering in which near surface atoms receive enough momentum transfer perpendicular to the surface to overcome the surface potential barrier and thereby escape into the vacuum.

There are currently several types of equipment being most frequently used for plasma etching. Confined plasma reactors are one type of such apparatus which employ generally closely spaced parallel plates which are excited by an RF power source to induce and sustain the plasma therebetween. These relatively simple essentially parallel plate electrodes devices have the difficulty that the plasma density and ion energy cannot be separately controlled and accordingly high ion energies cannot be curtailed in high power requirement situations.

Typically, in the prior art, these reactors consist of a pair of closely separated nearly planar electrodes characterized by pressure on the order of 0.3–0.5 Torr operation for etch. This pressure generally gives them isotropic etch characteristics. Previously,, these reactors have been too slow for commercial etch use in a single wafer operation.

A major application for high aspect ratio holes is in the manufacture of semiconductor devices in the creation of contact holes, i.e., "VIAS" These VIAS are tiny holes made through a dielectric layer on the surface of an integrated circuit to permit electrical connection to the surface of the circuit or for connection to the metal interconnect strips which had been previously laid down on the dielectric layer overlaying the active elements of the circuit. However, such an etching process is not limited to integrated circuits since there are many devices and objects made from $SiO_x$, or glass which can be improved by an improved micromachinery process which can produce high aspect ratio holes in such materials.

The role of nitrogen in RIE of a $SiO_2$ has been reported, Smolinsky, J. Electro Chemistry, Vol. 129, No. 5, May 1982, pp. 1036–1040. This report indicated an improved aspect ratio blot did not overcome the problem of punch through as subsequently described.

Our inventive process will be explained in connection with some special problems in semiconductor integrated circuit manufacture, but it is understood that the applications of our process is not so limited.

Semiconductor integrated circuits require many low resistance connections between portions of the circuit. These are called interconnects. Interconnects are usually metal but can also be made from doped polysilicon. Several levels of interconnects separated by dielectric layers are usually required. Typically, the metal employed for the interconnects is Al or contains Al because it has low resistance and is relatively inexpensive to apply.

It is also necessary to provide connections between the different levels of interconnects. Broadly described, this is accomplished by opening a hole from the surface down through the dielectric layer at the selected location until the underlying interconnect is reached. Next, the hole or "VIA" is filled with low resistivity material, usually metal, down to the top of the dielectric and then the upper surface is coated with Al. Next, a thin coating of an antireflective coating (ARC), usually of titanium nitride, TiN, is applied over the metal layer. Next a resist is layered over the ARC layer and optically exposed with UV radiation to form a mask pattern. The patterned mask is used to control the etch of the metal to form the next level of interconnect. The ARC coating reduces optical reflections from the metal and enables a sharper focus on the mask of the optical images to be formed. A next layer of protective dielectric is applied over the interconnects.

In such multilayer structures, it is necessary to apply planarization processes to the surface of each dielectric layer to smooth the final surface of each layer so that metal does not have to cover sharp underlying edges and so that the photographic processes for the next layer will have a single flat depth of field for sharper focus. This planarization requirement has lead to a new problem. As a result of the large global planarization processes, as seen in FIG. 1, the distance from the planarized surface I to the underlying contacting surface across a single chip can now widely vary, i.e, 5500Å to 16500Å. The etch process for the VIAS must therefore be able to make the deeper holes 2' while at the same time not damaging the materials at the bottom of the shallow holes 2.

With conventional prior etch processes, in those instances where the VIA hole depths vary widely across the chip, the exposed ARC layer 8 at the bottom of the shallow VIAS 2 is frequently etched away even when the normal 350Å TiN ARC layer is thickened substantially to 1000Å. This results in sputtering of the underlying metal 7 and/or damage to the underlying surface 9. Also, in the prior processes, a polymer build up 10 usually occurs in the VIAS holes which is difficult to remove. Also, this often results in the resistance of the resultant VIAS being substantially higher.

SUMMARY OF THE INVENTION

It is an object of the invention to provide an etch process for making high aspect ratio holes in oxides of silicon, and/or glass.

It is a further object to provide an etch process that has a high etch rate of $SiO_x$ and/or glass and a low etch rate of TiN.

It is a further feature of this invention that it employs nitrogen, $CHF_3$ and He in a parallel plate reactor.

It is still a further object to provide an etch process for making contact VIAS in a silicon integrated circuit where the deep VIAS and shallow VIAS can differ in depth by a factor of more than three without damage to the underlying region of the shallow VIA.

It is a feature of this etch process invention that it employs a confined plasma in a high total pressure region heretofore used only for deposition.

It is a still further feature of this invention that while etching oxides essentially no polymer buildup in VIAS occur and that the aspect ratio of at least R=10 is attainable.

It is a still further feature of our invention that the use of He as a process gas improves the discrimination of the process with respect to TiN etching.

DETAILED DESCRIPTION OF THE INVENTION

In addition to eliminating the damage being done in the shallow VIAS by overetching, we have determined that it was imperative to have clean VIA walls and contacting surfaces in order to obtain a low resistance VIA with subsequent metallization. Conventional confined plasma parallel plate reactor etch of silicon oxide dielectric film in making semiconductor VIAS employs an admixture of fluorocarbon source gases $CHF_3$ and $CF_4$ with a small percentage of oxygen and/or inert gas like Argon or Helium. It is generally believed that the role of the oxygen is to combine with the carbon of the fluorocarbon, thereby releasing the fluorine which is believed to be the active etch specie. The oxygen/carbon combination is generally believed to help regulate/control the polymer buildup on the VIA walls which occurs from the large molecule formation of the carbon from the etching gases.

The polymer buildup incited us to seek a scavenger to capture the released carbon. This caused us to initially experiment with the addition of $N_2$ as a process gas on the theory that a more effective free radical scavenger was required to combine with the carbon and carbonaceous compounds before they could polymerized to form the long chain of carbon molecules deposits being seen on the walls of the VIAS. Unlike oxygen, the quantity of nitrogen in the process is not restricted in processes involving photoresist masks. The scavengers role of nitrogen from ammonia in $SiO_2$ etch is discussed by Smolinsky et al, J. Electro Chemistry, Vol. 129, No. 5, May 1982, pp. 1036–1040.

Our experiments have been carried out in two different confined plasma reactors manufactured by LAM Research Models ET01 and ET13. The configuration of the Model ET01 apparatus is disclosed in FIG. 2.

Figure 1:
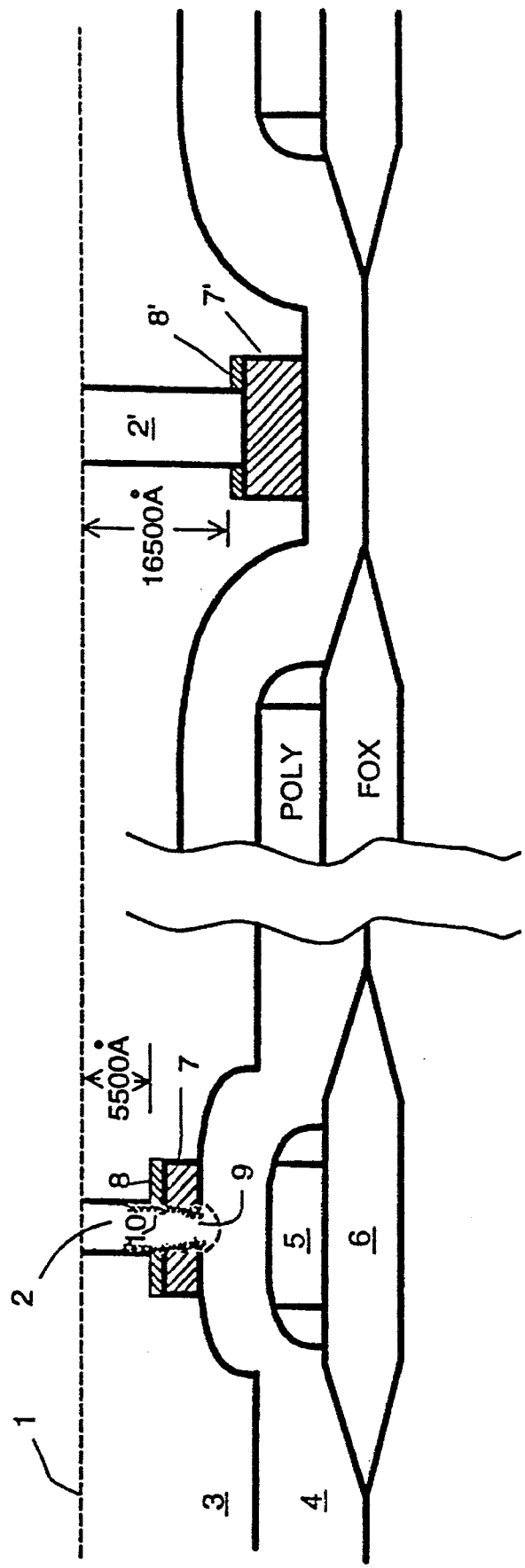
FIG. 1 is a cross section of an integrated circuit showing a deep and a shallow VIA as a result of global planarization.
Figure 2:
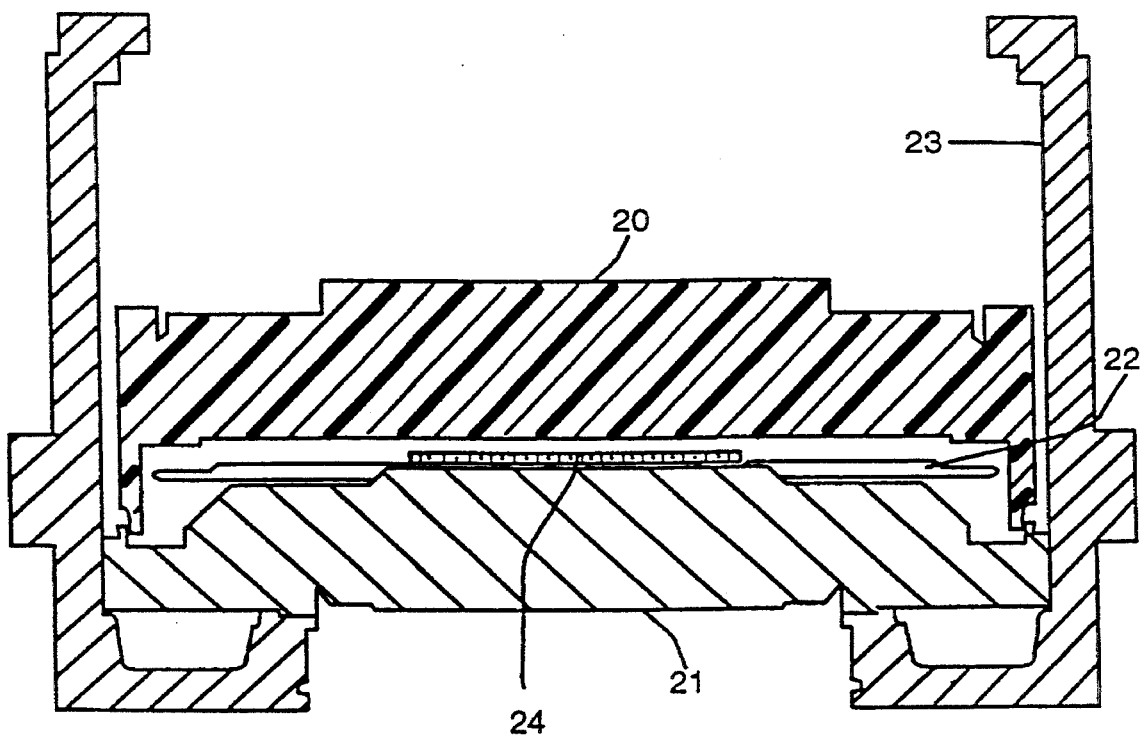
FIG. 2 is a schematic representation of a high pressure confined plasma reactor.

With reference to FIG. 2, the parallel plate plasma reactor housing 23 supports a lower electrode 21 of Al having a diameter of approximately 12 inches on which the wafer to be treated is clamped in its center 24 by clamps 22. The upper electrode 20 is usually graphite and the gap between the electrodes is small and adjustable. In our experiments the gap was set at 1.2 cm. The wafer is cooled by backside helium cooling, not shown. Clamping the wafer with clamp 22 improves thermal and electrical uniformity across the wafer surface. In Model ET13, the lower electrode is slightly domed at the center and provides better thermal conductivity for cooling. The confined ionized plasma is maintained in the small region between the electrodes 20 and 21.

Figure 3:
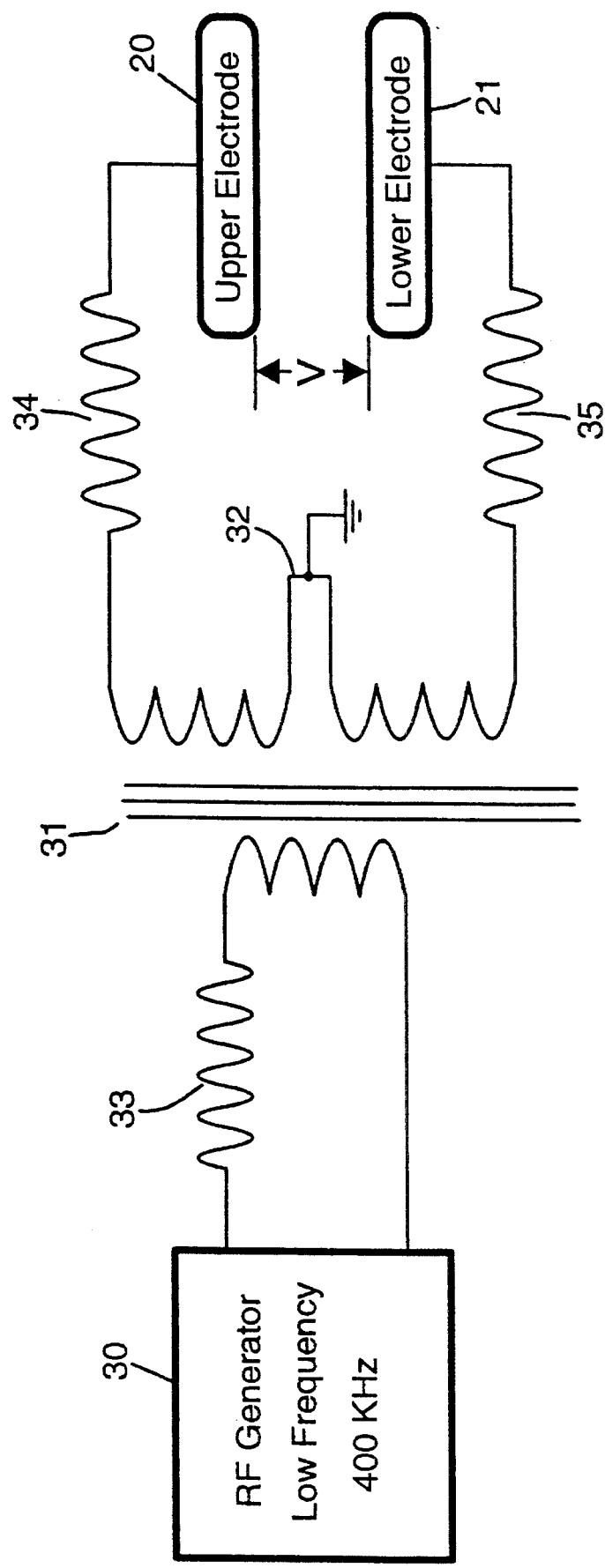
FIG. 3 is a schematic of RF excitation to said reactor electrodes.

With reference to FIG. 3, the electric field to excite and maintain the plasma is provided by RF generator 30 at approximately 400 KHz. The RF transformer 31, having a grounded center tap 32 is coupled symmetrically to the upper and lower electrodes 20 and 21. Elements 33, 34, and 35 are for matching and tuning the cavity impedance to the RF generator.

Our first set of factorial experiments were carried out at Power=800W, gap=0.75 cm and $CHF_3=CF_4=50SCCM$. We employed the standard admixture of etch gases of $CHF_3$, $CF_4$, and argon, and we included the addition of $N_2$ in the pressure range of 500–1900 mT. We discovered that to obtain wall angles of at least 86 degrees required a lower ratio of $CHF_3$ to $CF_4$ than 1/1, while on the other hand, higher $CF_4$ flow than $CHF_3$ resulted in a high etch rate on TiN. Our strategy was to develop a process to discriminate against TiN and where TiN would work as a stop layer so that the TiN in shallow VIA bottom region would not erode during the time that the deep VIAS are being etched. Using the conventional etch chemicals in the confined plasma at the traditional etching pressures, i.e., below 1.0T even with $N_2$ added, did not improve the TiN discrimination. In a patterned wafer, an etch selectivity to TiN of 6–10 was the best achievable as compared to $SiO_2$. During these experiments we observed several effects, such as faster etch rate of TiN near the center of the wafer than at edges, and inside VIA was etched faster than open areas. These observations led us to the discovery that the etch rate of the TiN was proportional to the immediate local temperature.

These factors lead us to seek a means to cool the plasma by increased inelastic collisions. This was accomplished by increasing the pressure by the addition of a high flow rate of He, a light mass gas. An inelastic collision is one in which there is no restriction on the type of energy interchanged and includes kinetic and internal or potential energy exchange.

Our next experiments were at higher total pressure 1.5T–3.0T with an admixture of $CHF_3$ and $CF_4$ with a high flow rate of He. The etch discrimination of TiN was still not much improved. Accordingly, for our next experiment, we deleted the $CF_4$ to increase TiN selectivity, but at these pressures, we achieved deposition instead of etching.

Finally, we introduced a small flow of $N_2$, retaining the high total pressure region and we discovered that the process reverted to etch and that the etch rate was proportional to the $N_2$ flow rate. We believe $N_2$ is reacting with the carbon and hydrogen so that more fluorine ion species were available for reacting with the $SiO_x$.

We have now been successful in fine tuning our process for optimum oxide to TiN etch rate selectivity. At pressure= 2700 mT, a gap of 1.2 cm, $CHF_3$=50SCCM, $N_2$=65SCCM, He=3500SCCM, at Power=1000W, we can obtain a selectivity of 21 on patterned TiN and a wall angle of 88±1 degree. We have made holes with aspect ratios of 10 without any evidence of polymer deposition on the side walls. We see no reason that aspect ratios of 30–40 will not be achievable.

We have made integrated circuits with the above described etching process and the VIAs have a resistance of 1.2 ohms with standard deviation of 0.3 ohms. Additionally, the process is more controllable because the etch rate on large oxide regions and smaller oxide regions is equal, i.e, no micro loading or RI lag and hence no aspect ratio dependency.

Figure 4:
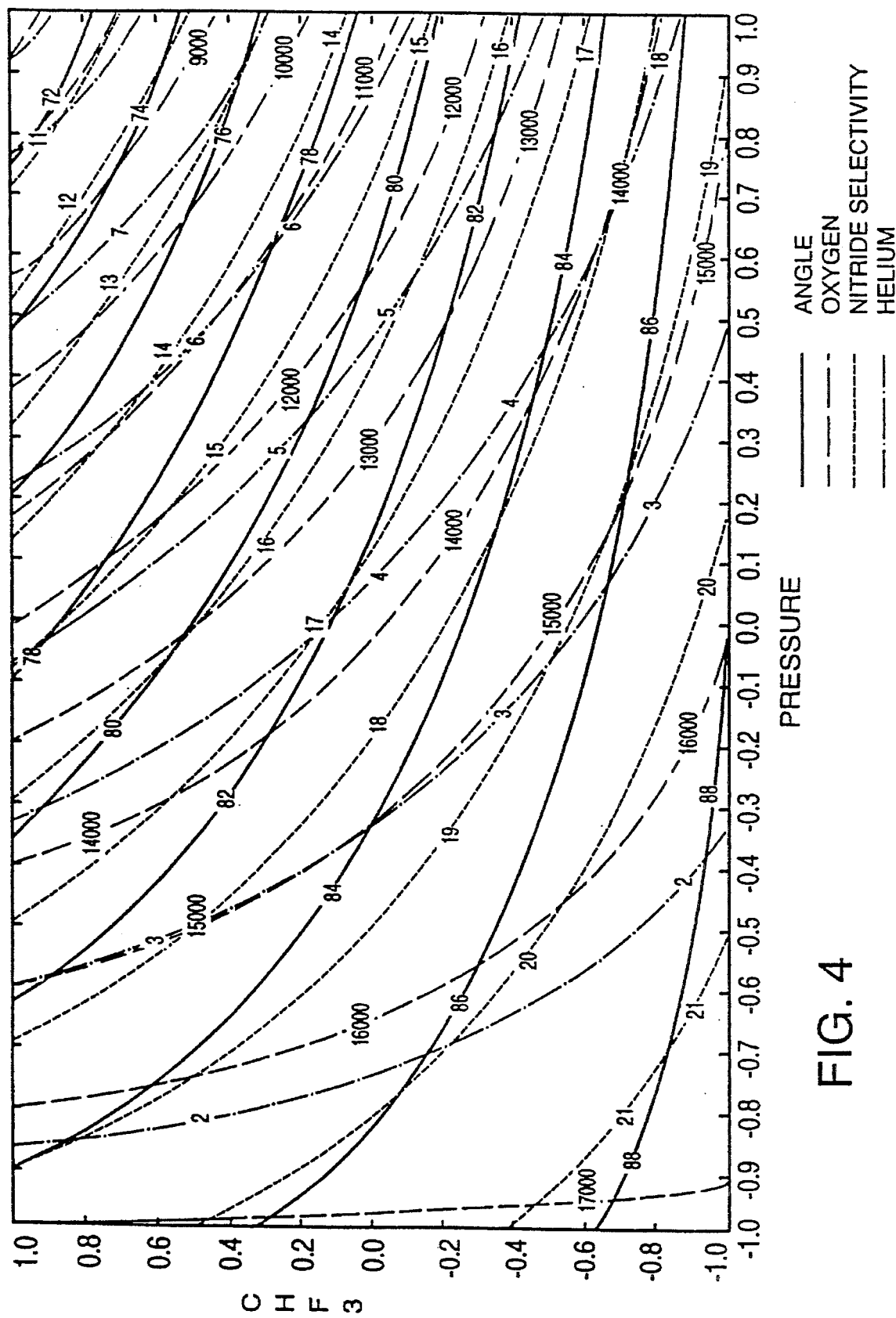
FIG. 4 is a contour plot of parameters of the inventive process.

Our experiments have also shown that the successful and improved flow high aspect ratio process is obtained with a broad range of process parameters. A wide margin of $CHF_3$ with respect to TiN selectivity is also identified, with respect to TiN selectivity. As seen in FIG. 4, the values of uniformity, wall angle, and TiN selectivity are nearly the same across the 3000 mT to 3500 mT pressure range for parameters 3000 mT/800W/1.2 cm/50 $CHF_3$/3500 He/60 $N_2$ with a wall angle close to 88 and selectivity of 21. By adjusting the $N_2$ flow rate, and power, we were able to achieve somewhat higher oxide etch rate and higher TiN selectivity.

To increase the aspect ratio (i.e., more vertical wall angles), we would increase the $N_2$ flow rate without any necessary changes in the other parameters.

The invention herein has been described in conjunction with the specific embodiment of the drawings. It is not our intention to limit our invention to any specific embodiment and the scope of the invention should be determined by our claims.

With this in view, what is claimed is:

1. In a method for plasma etching a $SiO_x$ material comprising
   (a) establishing a plasma in a vacuum container in a confined region between two closely displaced planar electrodes by providing a flow of reactive gases to said confined region and RF power at a frequency on the order of 400 KHz across said electrodes,
   (b) fastening said $SiO_x$ material to be etched to one of said electrodes, The Improvement Comprising,
   1. said reaction gases including $CHF_3$,
   2. cooling said plasma by inelastic collisions, and
   3. selecting the said flow of gases to obtain a total chamber pressure, p, where 10.0 Torr>p>1.5 Torr wherein said step of cooling includes causing a high volume flow rate of light mass gas to be included in said reaction gases, which flow rate of said light mass gas is approximately 50–100 times greater than the flow rate of $CHF_3$, wherein said light mass gas comprises Helium.

2. The method of claim 1 wherein said reaction gases further includes $N_2$ gas flow.

3. The method of claim 2 wherein the rate of etch of said $SiO_x$ is regulated by regulating said $N_2$ gas flow rate.

4. The method of claim 2, wherein the rate of etch of said $SiO_x$ is regulated by regulating said $N_2$ gas flow rate in the region of 40–400 percent of the $CHF_3$ flow rate.

5. The method of claim 2, wherein the flow rate of $CHF_3$ and $N_2$ are of the same order and the flow rate of light mass cooling gas is on the order of 50–100 times greater than either $CHF_3$ or $N_2$ volume flow rate.

6. The method of claim 5, wherein the wafer to be etched is also coated with a TiN layer prior to being etched, and wherein said etch selectively etches said silicon and silicon compounds at a rate much faster than said TiN is etched by said plasma.

7. The method of claim 6 wherein the $SiO_x$ to TiN etch rate selectivity is on order of 20/1.

8. The method of claim 2 wherein the etch products produced by said plasma reaction with said silicon compounds are substantially entirely volatile for a time sufficient to permit said etch products to be removed from said vacuum container before redeposition.

9. The method of claim 6 wherein said TiN is a stop layer such that clean walled high aspect ratio shallow holes can be simultaneously etched in said wafer as deep holes, where said deep holes can be on the order of three times deeper than the shallow holes.

10. In a method for producing interlayer metal interconnects in an integrated circuit having metal interconnect strips thereon, comprising:

(a) applying a TiN layer over the top of said metal interconnect strips;

(b) applying a dielectric fill over said TiN coated metal interconnect strips;

(c) planarizing the top of said dielectric fill;

(d) applying and patterning a resist mask over the top of said metal interconnect strips;

(e) placing said patterned wafer into a confined plasma etch reactor and fastening said wafer onto an electrode of said reactor;

(f) introducing reaction gases, said reaction gases comprising $CHF_3$, $N_2$ and a light mass cooling gas into said confined plasma etch reactor;

(g) exciting said plasma by applying RF energy at approximately 400 KHz, wherein the said light mass cooling gas composes He and the He volume flow is 50–100 times greater than the volume flow rate of either $CHF_3$ or $N_2$ and the total flow is adjusted to establish a high pressure p where 10.0 Torr>p>1.5 Torr.

11. The method of claim 10 wherein said layer of TiN is on the order of 1000Å.

12. The method of claim 11 including a further step (h), said step (h) comprising filling said VIA holes with a Ti or Ti/TiN and a tungsten plug, said plug having a resistance on the order of 1.2 ohms for a 0.8 micron diameter VIA plug.

* * * * *